United States Patent
Shivareddy et al.

(10) Patent No.: US 10,920,314 B2
(45) Date of Patent: Feb. 16, 2021

(54) METHOD FOR MANUFACTURING A STEEL SHEET FOR A BATTERY CASE AND BATTERY CASE MADE ACCORDING THE METHOD

(71) Applicant: TATA STEEL UK LIMITED, London (BB)

(72) Inventors: Sai Shivareddy, Cambridge (GB); Sivasambu Böhm, Cambridge (GB); Samson Patole, Solihull (GB); Digvijay Bhagwan Thakur, Burbage (GB); Dammes Hans Van Der Weijde, Woerden (NL)

(73) Assignee: TATA STEEL UK LIMITED, London (GB)

( * ) Notice: Subject to any disclaimer, the term of this patent is extended or adjusted under 35 U.S.C. 154(b) by 179 days.

(21) Appl. No.: 16/082,576

(22) PCT Filed: Mar. 2, 2017

(86) PCT No.: PCT/EP2017/054932
§ 371 (c)(1),
(2) Date: Sep. 6, 2018

(87) PCT Pub. No.: WO2017/153254
PCT Pub. Date: Sep. 14, 2017

(65) Prior Publication Data
US 2019/0024230 A1    Jan. 24, 2019

(30) Foreign Application Priority Data

Mar. 7, 2016   (EP) .................................... 16158865

(51) Int. Cl.
*C23C 16/26*   (2006.01)
*H01M 2/02*   (2006.01)
*C01B 32/194*   (2017.01)

(52) U.S. Cl.
CPC ............ *C23C 16/26* (2013.01); *C01B 32/194* (2017.08); *H01M 2/027* (2013.01); *H01M 2/0292* (2013.01)

(58) Field of Classification Search
CPC combination set(s) only.
See application file for complete search history.

(56) References Cited

U.S. PATENT DOCUMENTS

2002/0160111 A1   10/2002   Sun et al.
2012/0121981 A1*   5/2012   Harimoto ............... H01G 11/30
429/213

(Continued)

FOREIGN PATENT DOCUMENTS

CN   104882570 A   9/2015
EP   1028480 A2   8/2000

(Continued)

OTHER PUBLICATIONS

English Machine Translation of KR20150106984. Cho et al. Korea. Sep. 23, 2015. (Year: 2015).*

(Continued)

*Primary Examiner* — Christopher P Domone
(74) *Attorney, Agent, or Firm* — Vorys, Sater, Seymour and Pease LLP

(57) ABSTRACT

A method for manufacturing a steel sheet or steel strip for a battery case including the steps of providing a Ni-plated steel sheet or strip, and applying a graphene based coating layer on the Ni-plated steel sheet or strip, wherein the graphene based coating layer is applied by chemical vapour deposition.

23 Claims, 3 Drawing Sheets

(56) References Cited

U.S. PATENT DOCUMENTS

| | | | | |
|---|---|---|---|---|
| 2014/0050971 A1* | 2/2014 | Tomomori | ............ | H01M 2/026 |
| | | | | 429/176 |
| 2014/0150247 A1* | 6/2014 | Flores Ramirez | ...... | C23F 11/00 |
| | | | | 29/592 |
| 2016/0137509 A1* | 5/2016 | Cho | .................... | C23C 16/0272 |
| | | | | 427/58 |
| 2016/0268060 A1* | 9/2016 | Onodera | ............... | H01M 2/026 |

FOREIGN PATENT DOCUMENTS

| | | |
|---|---|---|
| KR | 20150106984 A | 9/2015 |
| WO | 2015074752 A1 | 5/2015 |

OTHER PUBLICATIONS

International Search Report and Written Opinion datled Jun. 19, 2017 for PCT/EP2017/054932 to Tata Steel Nederland Technology B.V. filed Mar. 2, 2017.

* cited by examiner

METHOD FOR MANUFACTURING A STEEL SHEET FOR A BATTERY CASE AND BATTERY CASE MADE ACCORDING THE METHOD

CROSS-REFERENCE TO RELATED APPLICATIONS

This is a § 371 National Stage Application of International Application No. PCT/EP2017/054932 filed on Mar. 2, 2017, claiming the priority of European Patent Application No. 16158865.2 filed on Mar. 7, 2016

FIELD OF THE INVENTION

The invention relates to a method for manufacturing a steel sheet for a battery case as well as to a battery case made according to the method.

BACKGROUND OF THE INVENTION

Nickel plated steel strip is widely used in the production of battery cases for primary and secondary batteries. Nickel is typically electroplated onto mild steel strip in a continuous process, then annealed and temper rolled to get the desired mechanical and electrical properties for application in batteries. The electrical properties are important because the nickel plated battery can acts as a current collector electrode. Sometimes cobalt and graphite are electroplated or co-deposited to improve the performance by reducing the resistance in the battery along with better electrochemical stability preventing corrosion of the underlying low carbon steel.

However there are few issues regarding these coatings:
- nickel is prone to form semiconducting nickel hydroxide layer($\beta$-Ni(OH)2 or insulating nickel oxide in presence of alkaline solution present in primary alkaline batteries which reduces the conductivity of nickel and also the presence of this insulating layer causes 'ageing' of primary alkaline batteries;
- the addition of some transition metals like cobalt to nickel coated steel improves the conductivity, decreases the internal resistance and decreases the aging effect as cobalt oxide is more stable and more conducting that nickel oxides. However these metals are expensive and could be toxic. Presence of high concentration of toxic heavy metal ions requires special care during battery disposal, and
- the process of battery can making involves deep drawing and a wet lubricant is essential for this process. After the deep drawing the battery case has to be cleaned with an alkaline solution to remove the lubricant that was used, which is an extra step which bring further costs.

Another solution to lower the internal resistance of batteries is the application of a conducting graphitic paint once the battery can is made. The graphite on the can provides a better interface to the metal current collector than the bare metal electrode in the battery.

Although the battery performs better with the graphite paint than in its absence, the graphite coating inside the battery can is not uniformly coated on the inside surface. This is due to the nature of the spraying process where the spray does not reach the surface at the bottom of the can due to its cylindrical geometry. This process is also not very efficient in terms of the amount of graphite material used due to spillage outside the battery can and down time due to clogging of the spray nozzle with the graphite particles present in the paint.

Graphite based coating systems do not work very well due to the problem of poor adhesion of such conducting coatings to the surface of steel. Chromate based primers have to be used to improve adhesion for such graphite resin coated steel strip. The coatings with graphite are not very uniform and these rough coatings can result in problems with welding. Chromium also has adverse effect on health and environment and use of chromium is banned in Europe under current regulations. The other issue of graphite coatings is they are detrimental to corrosion.

OBJECTIVES OF THE INVENTION

It is an objective of the present invention to provide a steel sheet or steel strip for a battery case with an improved conductivity.

It is another objective of the present invention to provide a steel sheet or steel strip for a battery case with decreased contact resistance.

It is another objective of the present invention to provide to provide a steel sheet or steel strip for a battery case with an increased corrosion resistance.

It is another objective of the present invention to provide to provide a steel sheet or steel strip for a battery case with a coating with reduced thickness.

It is another objective of the present invention to provide a steel sheet or steel strip for a battery case with a reduced amount of Ni required.

It is another objective to provide a steel sheet or steel strip for a battery case wherein any additional coating layers such as cobalt and graphite coating layers are no longer required.

It is another objective of the present invention to provide a steel sheet or steel strip for a battery case wherein elimination of an extra step of spraying graphite paint on internal side of battery can or casing is achieved.

It is another objective of the present invention to provide a steel sheet or steel strip for a battery case wherein a combined annealing of the full hard and/or annealed steel sheet or steel strip and growth of the graphene coating on the steel sheet or steel strip is obtained.

It is another objective of the present invention to provide a steel sheet or steel strip for a battery case with a coating which has sufficient lubricating properties that no further lubricant is needed for a drawing operation.

It is still another objective of the present invention to provide a method to cost effectively apply a graphene based coating on a steel sheet or steel strip.

DESCRIPTION OF THE INVENTION

According to a first aspect of the invention one or more of the objectives of the invention are realized by providing a method for manufacturing a steel sheet or steel strip for a battery case, wherein the method comprises:
- providing a Ni-plated steel sheet or strip, and
- applying a graphene based coating layer on the Ni-plated steel sheet or strip.

The graphene in the graphene based coating comprises one or more layers graphene, preferably not more than 20 layers and the graphene based coating may further comprise amorphous or crystalline sp2 hybridized carbon or mixtures thereof.

Graphene is electrochemically stable in an alkaline environment and also provides passivation of the nickel surface preventing the formation of nickel oxide. It provides a low contact resistance with the cathode mix which in alkaline batteries is a mixture of graphite and manganese oxide. The graphene layer on the nickel plated steel is also a good solid state lubricant hence the surface of nickel plated steel provides self lubrication for processes like deep drawing (drawing, redrawing and wall ironing) and forming.

A solvent based graphene coating layer can be applied by coil coating, spraying, bar coating and like methods. To this end the graphene based coating layer comprises a coupling agent to couple the graphene to the steel sheet or steel strip. Such a coupling agent is for instance an organofunctional silane or an organofunctional siloxane.

However, according to a preferred embodiment of the invention it is provided that the graphene based coating layer is applied by chemical vapour deposition (CVD). With CVD a good adhesion between the graphene based coating and the steel sheet or strip is obtained which is due to the van der Waals interaction. The advantage of using CVD for depositing the graphene based coating layer is that a very low contact resistance is obtained, which is in the order of 0.1-10 mohm·cm2. Such a low contact resistance can not be obtained when a solvent based graphene coating is applied on the steel sheet or strip.

According to a further aspect of the invention it is provided that the method comprises the steps of:
bringing the Ni-plated steel sheet or strip in an enclosure,
heating the content of the enclosure, and
supplying a graphene precursor into the enclosure.

The graphene precursor used in the method is a carbon containing solid or gas. If a solid is used, the solid is first dissolved in a solvent, and the solution with the solid is injected or first vaporised and then injected in the enclosure.

If a gas is used it can be injected directly into the enclosure or injected with a carrier gas into the enclosure Argon or another inert gas could be used as a carrier gas. As a gas graphene precursor one or more gases from the group of acetylene, methane and ethylene gas is used. As an alternative coke oven gas can be used which contains methane and ethylene.

According to a further aspect of the invention the graphene based coating layer is applied to the Ni-plated steel sheet or strip in an annealing furnace. The Ni-plated steel sheet or strip has to be subjected to an annealing step in order to get a Fe—Ni diffusion layer for the desired electrical properties, that is a lower internal resistance. It was found that the graphene based layer could be applied by means of CVD during the annealing of the Ni-plated steel sheet or steel strip wherein the annealing furnace serves as an enclosure for the CVD process.

The Ni-plated steel sheet or strip is heated in the enclosure to a temperature in the range of 400-750° C., preferably in the range of 500-750° C. and more preferably in the range of 600-750° C. These temperature ranges are suitable for both the annealing process as well as for the CVD process.

In order to prevent oxidation of the Ni-plated steel sheet or strip it is provided that the atmosphere in the enclosure comprises an inert gas, or nitrogen gas, or a mixture of hydrogen gas and nitrogen gas or a mixture of hydrogen gas and an inert gas.

Many CVD processes are carried out under vacuum conditions in order to reduce unwanted gas-phase reactions and to improve uniformity of the deposited layers. A vacuum, even at low vacuum ranges, requires a set-up with specific vacuum pump systems and vacuum locks, which would complicated the method to a great degree and would not be economically viable. However, very good results were realized by applying the graphene based coating layer at a pressure in a near atmospheric pressure range of 0.7-2 bar in the enclosure. With such a near atmospheric pressure range the method can easily be integrated with existing annealing furnaces. The concentration of reactive gases used in CVD of graphene coating on steel sheet or strip has been maintained at very low level, that is in the range of 1.0% to 5.0% hydrogen and/or 0.5% to 2.5% acetylene and typically in the range of 1.3% -3.5% hydrogen and/or 0.65-1.7% acetylene. With these concentration levels the mixture of reactive gases remains below explosion limit. A high quality graphene coatings was deposited under these concentration levels. This also supports the continuous production of graphene coated steel sheet or strip at lower level of consumables.

The annealing of the Ni-plated steel sheet or strip can be carried out as a batch process or in a continuous process. In the latter process the annealing furnace is a continuous annealing furnace.

Chemical vapour deposition growth time for the graphene coating layer on steel sheet or strip are in the range of 5 seconds to 900 seconds, preferably in the range of 5-400 sec, more preferably in the range of 5-100 sec and even more preferably in the range of 5-20 sec. The growth time means the residence time that the steel sheet or strip is in the enclosure and in contact with the reactive gases. Higher growth times can be used, however the lower growth times allow the continuous annealing and graphene synthesis on steel sheet or strip resulting in continuous production. An additional aspect of the invention is to be able to use a full hard steel sheet or strip to be able to anneal and simultaneously be deposited with graphene coating.

According to a further aspect of the invention the method comprises a temper rolling step after deposition of the graphene based coating layer. Since the temperature in the enclosure, the annealing furnace, should be high enough both for the CVD of the graphene based coating and the annealing of the steel sheet or strip, that is a temperature above 400° C., it will be necessary to temper roll the steel sheet or strip.

It is further provided that the Ni-plated steel sheet or strip is provided on the side of the sheet corresponding with the inner surface of the battery case with a Ni coating layer and optionally a Co coating layer on the Ni coating layer and on the opposite side with a Ni coating layer. Without the optional Co coating layer a better interfacial resistance between the graphene based coating layer and the Ni coating layer can be realized than between a Ni based coating layer and a Co coating layer.

The invention also comprises a Ni-plated steel sheet for a battery case wherein the sheet at least at the side of the sheet corresponding with the inner surface of the battery case is provided with a graphene based coating layer. It is preferred to have the graphene based coating on both the sides of the Ni-plated steel sheet as the lubrication provided from the graphene layer on both the sides of the sheet help in the deep drawing process. Additionally, the graphene coating on both sides also helps to improve the performance of the nickel plated steel casing, i.e. current collector electrode of primary battery.

According to a further embodiment the Ni-plated steel sheet or strip is provided on the side of the sheet corresponding with the inner surface of the battery case with a Ni coating layer and on the opposite side with a Ni coating layer and optionally a Co coating layer on the Ni coating layer. Without the optional Co coating layer a better interfacial resistance between the graphene based coating layer and the Ni coating layer can be realized than between a Ni based coating layer and a Co coating layer.

Method for manufacturing a battery case comprising the steps of:
providing a Ni-plated steel sheet or strip,
bringing the Ni-plated steel sheet or strip in an enclosure,
heating the content of the enclosure,
supplying a graphene precursor into the enclosure,
cooling the steel sheet or strip,
cutting plates or discs from the steel sheet or strip, and performing a drawing operation on the plates or discs without applying a drawing lubricant on the steel sheet or strip or the plates and/or discs cut from it.

According to a further aspect the method comprises a temper rolling step after deposition of the graphene based coating layer and optionally another annealing step after the temper rolling could be carried out.

According to a further aspect the method comprises that in the enclosure a pressure is maintained in a near atmospheric pressure range of 0.7-2 bar.

According to a further aspect the enclosure is an annealing furnace or a continuous annealing furnace.

The thickness of the steel sheet or strip used for the battery can is in the range of 0.1-0.5 mm and the Ni coating layer is applied with a thickness in the range of 0.1-50 μm. The nickel plated steel sheet or strip can be full hard or annealed strip.

EXAMPLE

The example relates to the growth of graphene on two different substrates, a Ni—Co plated mild steel and a Ni plated mild steel, for AA batteries 275 μm gauge by means of a CVD process using a CVD reactor. After the CVD process, the samples were characterised by Raman spectroscopy using a spectrometer with a laser wavelength of 514.5 cm−1. Scanning electron microscopy images of the surface were obtained using a field emission SEM. The graphene on plated steel substrates were then tested for its lubrication and formability using a manually operated dome apparatus. Thereafter, a multi-stage deep drawing test was performed on the samples to obtain battery cans.

The planar samples were also tested for their contact resistance using a standard fuel cell interfacial contact resistance (ICR) measurement set up.

The CVD process was performed at a pressure of 700 mbar and at a temperature of 600-750° C. using argon and/or nitrogen as the carrier gas along with hydrogen and acetylene in a ratio of 2:1. Acetylene flow was turned off and the furnace was cooled to room temperature at 10 deg C/min. The growth time for all the samples was in the range of 5-900 seconds.

The results of the measurement on the example are discussed on the basis of the drawings.

DETAILED DESCRIPTION OF THE DRAWINGS

Figure 1:
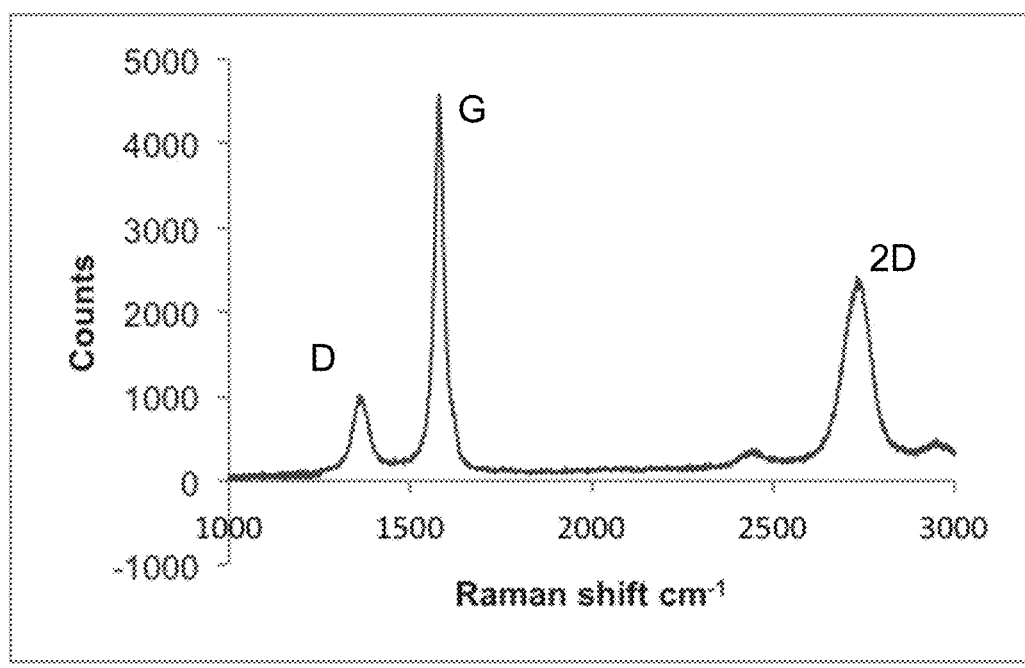
FIG. 1 shows a Raman spectrum of the graphene based coating on a steel substrate at 750° C.

In FIG. 1 a Raman spectrum is shown of the graphene based coating on the sample. Raman spectroscopy is a widely used characterisation technique to determine the presence of graphene. The most common peak in the spectrum are the D band around 1365 cm−1, G band at 1584 cm−1 and 2D band around 2700 cm−1. Generally a low D band signifies lower disorder in the sp2 hybridized carbon crystal structure. G band is always observed in graphitic carbons (any crystalline sp2 carbon or amorphous carbon with crystalline inclusions) and 2D band for graphene is symmetric about the centre of the peak compared to that of graphite.

All samples prepared by CVD were characterized by Raman spectroscopy. The growth process was optimised for a low D peak as indicated in the shown Raman spectrum by varying the temperature, pressure and gas ratios in the annealing enclosure. The optimal values of temperature was found to be in the range of 600-700 degree Celsius, pressure in the range of 0.7-2 bar and hydrogen to acetylene ratio of 2:1. A symmetric 2D peak with a peak width >30 cm−1 wavenumber here signifies few layer graphene without much order in the stacking of the graphene layers without the standard van der Waals interaction seen between standard graphitic layers.

Figure 2:
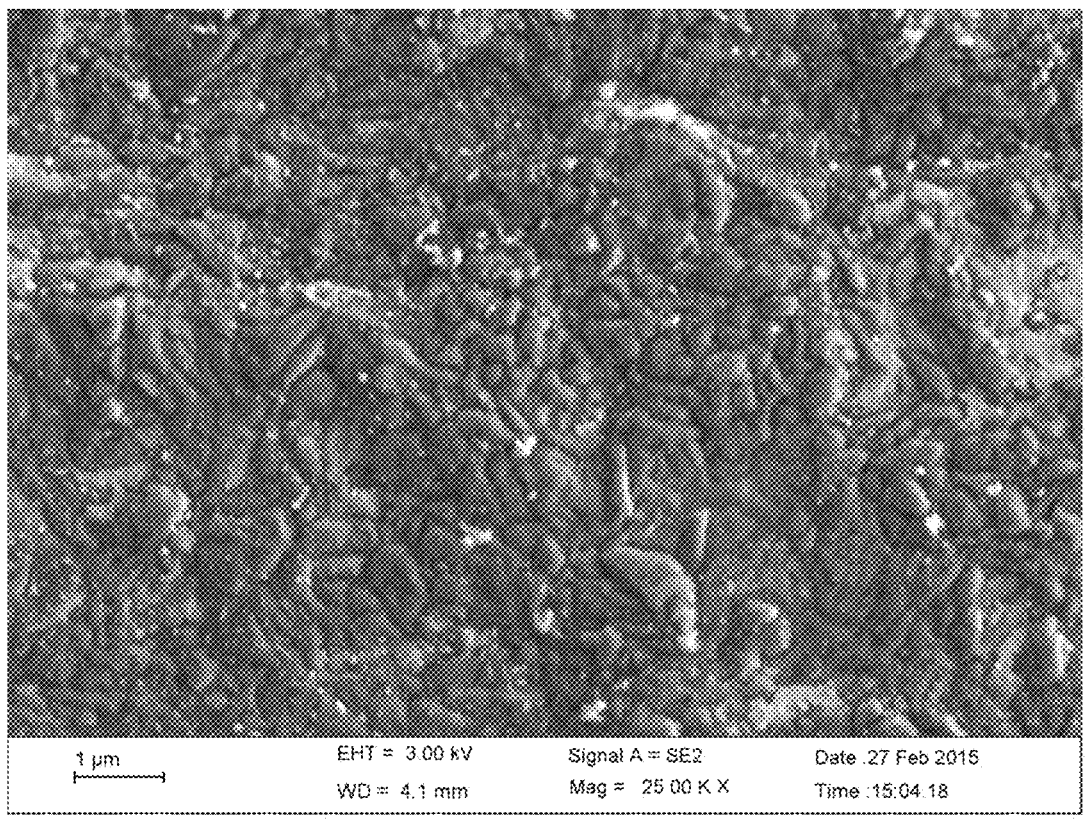
FIG. 2 shows a SEM image of the topography of the Ni plated steel surface with an applied graphene based coating at 750° C.

FIG. 2 shows a SEM image of the topography of the Ni plated steel surface with an applied graphene based coating. The magnification of the SEM image is 25000. The SEM micrograph shows the type of grains on the nickel-graphene surface. Growth of graphene follows the surface in a uniform manner indicating in-plane conformal growth. The average roughness of the Ni plated surface is 25-50 nm but the peak roughness can be in the order of 100 nm or more. Given that there are 3 graphene layers per nanometer, a 5 nm thick multilayer graphene sample will have about 15 layers. As a result of the surface roughness and the ultrathin nature of the CVD graphene based coating it is not very straightforward to measure the layer thickness.

Figure 3:
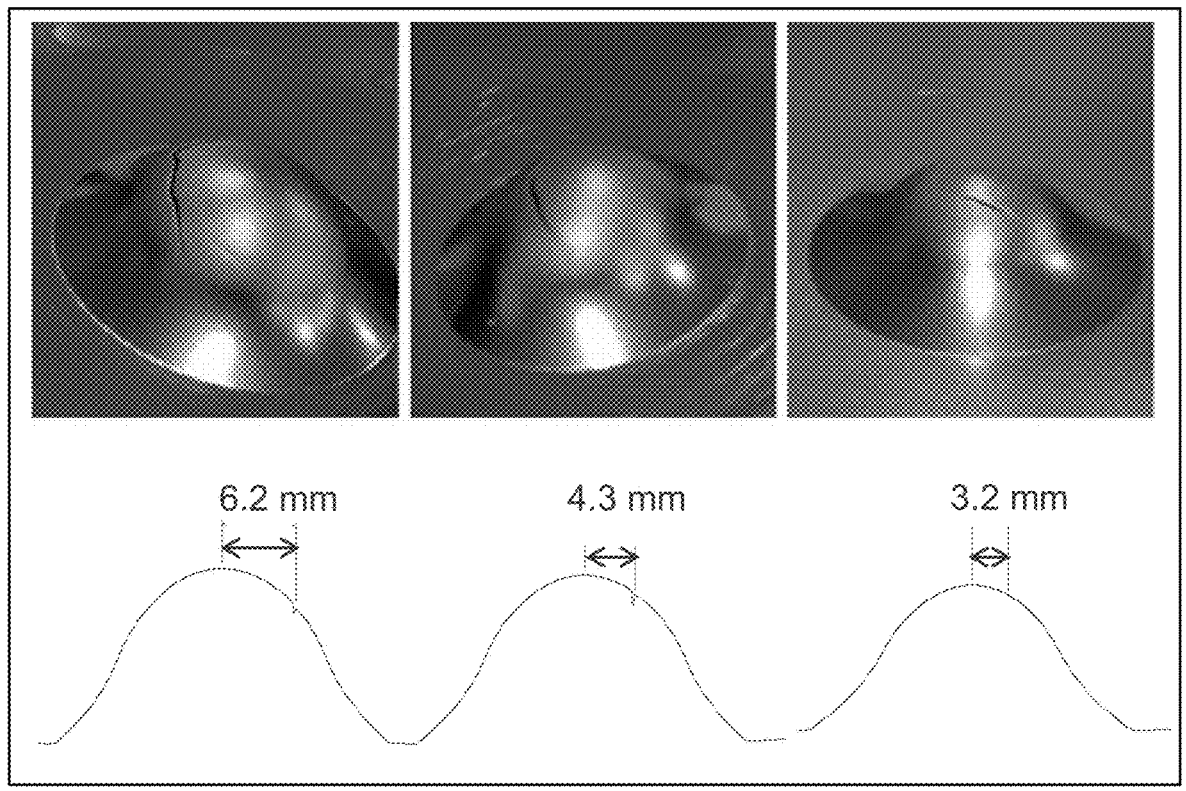
FIG. 3 shows the results of mechanical tests performed on the graphene coated samples.

FIG. 3 represents the results of mechanical tests performed on the graphene coated samples. Domes with the as grown samples were made using a manually operated dome apparatus. The domes in FIG. 3 from left to right are respectively formed from samples without any lubrication (left), with an industrial lubricant (middle) and with the graphene based coating (right). The sample with the graphene based coating is self-lubricating. In this test, information on the formability is obtained from the maximum height of the dome before rupture and the lubrication is obtained from the distance of the rupture to the centre point of the dome in contact with the ball. In an ideal biaxial strain scenario with good lubrication the rupture is expected at the middle. The larger the friction, larger will be the distance of the rupture from the centre point of the dome. This test was performed to have an indication of the lubricating properties of the graphene layer under a high pressure contact area, similar to forming steps during battery production (deep drawing). Uncoated material was tested both dry as well as lubricated, graphene sample was tested dry. All samples were about 0.275 mm in thickness. For the dry lubrication tests the tool was cleaned with acetone. The following points were noted after the test:
lubrication on the samples with grease was not optimal as the crack did not form exactly at the top of the dome.
swirl pattern on the samples indicate some rotational friction of the ball, possibly influencing the results.

crack formation on the graphene sample occurred closer to the top than on the uncoated lubricated sample, suggesting a high level of lubrication (low friction coefficient).

The rupture point distances from the centre of the dome (in mm) are 6.23, 4.35 and 3.2 for the bare substrate, substrate with industrial grease and substrate with graphene based coated layer sample respectively.

The samples were subjected to graphene growth from 600-750° C. The sample grown at the 750° C. did not show much difference in the maximum height of the dome implying that the additional high temperature growth did not alter formability significantly. Additionally, the grain analysis showed that the material tested has been recrystallized similar to typical annealed nickel plated steel confirming the CVD treatment maintains the mechanical properties of the steel sheet or strip required for deep drawing of battery casing. As the few layer graphene coating sample showed better lubrication than the standard industrial grease used in packaging, deep drawing was performed without any lubricant on the graphene coated side. The other side did not have any graphene present hence it was applied with some amount of lubrication.

Figure 4:
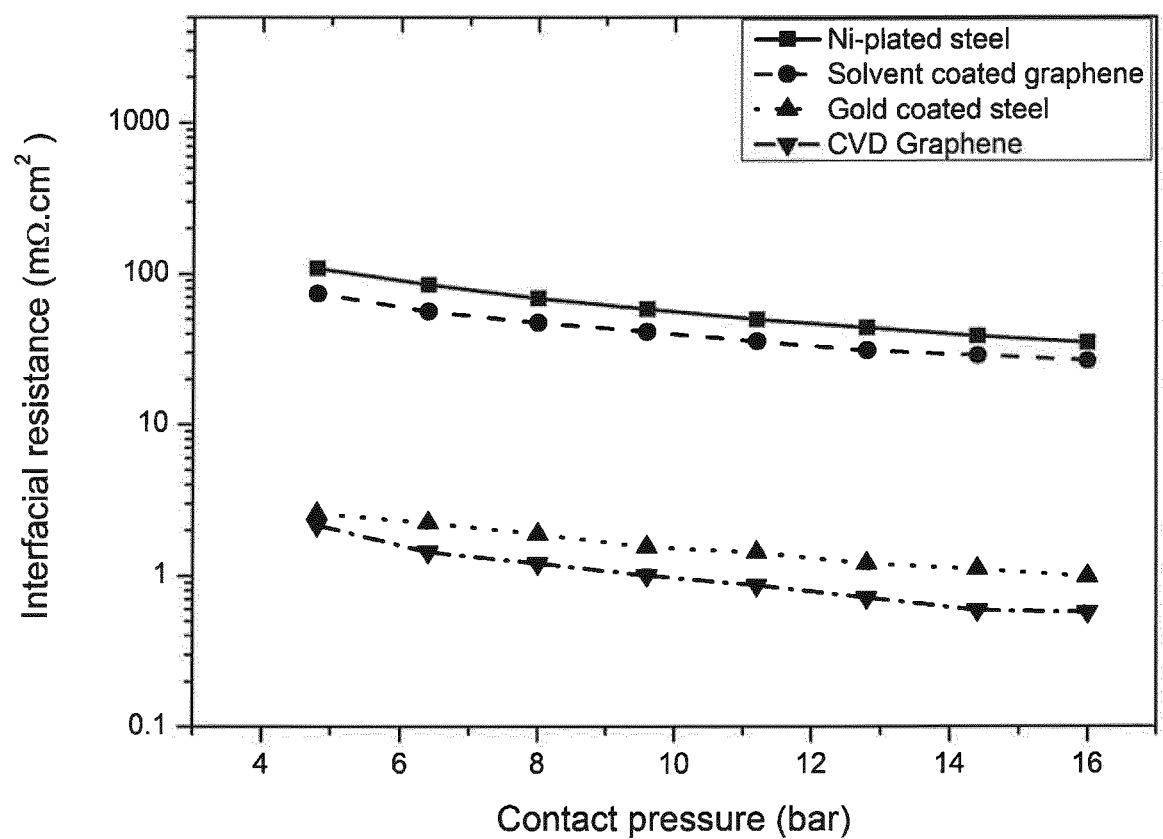
FIG. 4 shows the contact resistance of various graphene coated samples.

The curves in FIG. 4 show the contact resistance of various graphene coated samples. The contact resistance measurements were performed according to the procedure for fuel cell bipolar plates where the sample is sandwiched between two carbon sheets (toray) and pressed with a known pressure on both the sides with two flat contacts coated with gold. As the pressure between the contact area of carbon sheet and the gold electrodes increases, a resistance measurement is taken between the contacts by measuring the current at a known voltage. The measurement is then taken for a gold plated stainless steel for comparison. Although designed for a fuel cell bipolar plate measurement, this setup can give an idea of the contact resistance when in contact with a graphite containing cathode mix that is in contact with the current collector in the battery (coated nickel plated steel). The contact resistance curves for CVD coated samples are as low as 1 mOhm·cm2 in some cases lower than gold plated stainless steel shown in red in the bottom figure.

The invention claimed is:

1. A method for manufacturing a battery case comprising the steps of:
    providing a Ni-plated steel sheet or strip,
    bringing the Ni-plated steel sheet or strip in an enclosure,
    heating the content of the enclosure,
    supplying a graphene precursor into the enclosure,
    applying a graphene based coating layer on the Ni-plated steel sheet or strip,
    cooling the steel sheet or strip,
    cutting plates or discs from the steel sheet or strip, and
    performing a drawing operation on the plates or discs without applying a drawing lubricant on the steel sheet or strip or the plates and/or discs cut from the steel sheet or strip.

2. The method according to claim 1, wherein the graphene based coating layer is applied by chemical vapour deposition.

3. The method according to claim 1, wherein the Ni-plated steel sheet or strip is heated in the enclosure to a temperature in the range of 400-750° C.

4. The method according to claim 2, wherein the graphene precursor is a carbon containing solid or gas.

5. The method according to claim 2, wherein the graphene precursor is one or more gases from the group of acetylene, methane and ethylene gas.

6. The method according to claim 2, wherein the Ni-plated steel sheet or strip is heated in the enclosure to a temperature in the range of 400-750° C.

7. The method according to claim 2, wherein the atmosphere in the enclosure comprises an inert gas, or nitrogen gas, or a mixture of hydrogen gas and nitrogen gas or a mixture of hydrogen gas and an inert gas.

8. The method according to claim 2,
    wherein the graphene precursor comprises acetylene gas,
    wherein the atmosphere in the enclosure comprises a mixture of hydrogen gas and nitrogen gas or a mixture of hydrogen gas and an inert gas,
    wherein concentration levels of the hydrogen and/or acetylene in the atmosphere in the enclosure are kept in the range of 1.0% to 5.0% hydrogen and/or 0.5% to 2.5% acetylene.

9. The method according to claim 2, wherein the graphene based coating layer is applied at a pressure in a near atmospheric pressure range of 0.7-2 bar in the enclosure.

10. The method according to claim 2, wherein chemical vapour deposition growth time for the graphene coating layer on the steel sheet or strip is in the range of 5 seconds to 900 seconds.

11. The method according to claim 2, wherein the enclosure comprises an annealing furnace, wherein the graphene based coating layer is applied to the Ni-plated steel sheet or strip in the annealing furnace.

12. The method according to claim 11, wherein the annealing furnace is a continuous annealing furnace.

13. The method according to claim 1, wherein the method comprises a temper rolling step after deposition of the graphene based coating layer.

14. The method according to claim 1, wherein the Ni-plated steel sheet or strip is provided on the side of the sheet or strip corresponding with the inner surface of the battery case with a Ni coating layer and optionally a Co coating layer on the Ni coating layer and on the opposite side with a Ni coating layer.

15. The method according to claim 2, wherein the Ni-plated steel sheet or strip at least at the side of the sheet or strip corresponding with the inner surface of the battery case is provided with the graphene based coating layer.

16. The method according to claim 15, wherein the Ni-plated steel sheet or strip is provided on the side of the sheet or strip corresponding with the inner surface of the battery case with a Ni coating layer and on the opposite side with a Ni coating layer.

17. The method according to claim 15, wherein the Ni-plated steel sheet or strip is provided on the side of the sheet or strip corresponding with the inner surface of the battery case with a Ni coating layer and on the opposite side with a Ni coating layer and a Co coating layer on the Ni coating layer.

18. The method according to claim 2, wherein the method comprises a temper rolling step after deposition of the graphene based coating layer.

19. The method according to claim 2, wherein the Ni-plated steel sheet or strip is heated in the enclosure to a temperature in the range of 600-750° C.

20. The method according to claim 8, wherein the concentration levels of hydrogen and/or acetylene are kept in the range of 1.3% -3.5% hydrogen and/or 0.65-1.7% acetylene.

21. The method according to claim 2, wherein chemical vapour deposition growth time for the graphene coating layer on steel sheet or strip is in the range of 5-100 sec.

22. The method according to claim 14, wherein the Ni-plated sheet or strip at least at the side of the sheet or strip corresponding with the inner surface of the battery case is provided with the graphene based coating layer.

23. The method according to claim 22,
wherein the graphene precursor is a carbon containing solid or gas,
wherein the enclosure comprises an annealing furnace, wherein the graphene based coating layer is applied to the Ni-plated steel sheet or strip in the annealing furnace,
wherein annealing in the annealing furnace forms a Ni-Fe diffusion layer,
wherein the graphene based coating layer is applied by chemical vapour deposition in the annealing furnace during the annealing of the Ni-plated steel sheet or steel strip,
wherein the Ni-plated steel sheet or strip is heated in the enclosure to a temperature in the range of 400-750° C., wherein the atmosphere in the enclosure comprises an inert gas, or nitrogen gas, or a mixture of hydrogen gas and nitrogen gas or a mixture of hydrogen gas and an inert gas.

* * * * *